(12) United States Patent
Watanabe et al.

(10) Patent No.: US 7,587,687 B2
(45) Date of Patent: Sep. 8, 2009

(54) SYSTEM AND METHOD FOR INCREMENTAL SYNTHESIS

(75) Inventors: Yosinori Watanabe, El Cerrito, CA (US); Michael Meyer, Palo Alto, CA (US); Luciano Lavagno, Berkeley, CA (US); Alex Kondratyev, Campbell, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 11/324,032

(22) Filed: Dec. 30, 2005

(65) Prior Publication Data
US 2007/0157131 A1 Jul. 5, 2007

(51) Int. Cl.
*G06F 17/50* (2006.01)
(52) U.S. Cl. .............................. 716/3; 716/2
(58) Field of Classification Search ............... 716/3, 716/2
See application file for complete search history.

(56) References Cited

U.S. PATENT DOCUMENTS

| | | | | |
|---|---|---|---|---|
| 5,812,416 A | * | 9/1998 | Gupte et al. | 716/2 |
| 5,867,396 A | * | 2/1999 | Parlour | 716/18 |
| 2005/0149898 A1 | * | 7/2005 | Hakewill et al. | 716/18 |
| 2007/0067751 A1 | * | 3/2007 | Seno | 716/13 |
| 2007/0156378 A1 | | 7/2007 | McNamara | |
| 2007/0168893 A1 | | 7/2007 | Watanabe et al. | |
| 2007/0174795 A1 | | 7/2007 | Lavagno et al. | |

OTHER PUBLICATIONS

Brand, Daniel; Incremental Synthesis; IEEE/ACM International Conference; 1994; pp.1-5.*

* cited by examiner

*Primary Examiner*—Jack Chiang
*Assistant Examiner*—Suresh Memula
(74) *Attorney, Agent, or Firm*—Duane Morris LLP; Stephen C. Durant

(57) ABSTRACT

A method of synthesis of a model representing a design is provided comprising: inputting to a synthesis tool information representing a design at a level of abstraction; using a synthesis tool to automatically translate the information representing a design at a level of abstraction to a model representing the design at a lower level abstraction; and producing a record the information input to the tool representing the design at the level of abstraction.

10 Claims, 3 Drawing Sheets

SYSTEM AND METHOD FOR INCREMENTAL SYNTHESIS

CROSS REFERENCE TO RELATED APPLICATIONS

This application relates to the following commonly assigned patent applications: System and Method for Verification Aware Synthesis, filed Dec. 30, 2005; System and Method for Generating a Plurality of Models at Different Levels of Abstraction from a Single Master Model, filed Dec. 30, 2005; and System and Method for Synthesis Reuse, filed Dec. 30, 2005, each of which is expressly incorporated herein in its entirety by this reference.

BACKGROUND OF THE INVENTION

1. Field of the Invention

The invention relates in general to the computer automated design, and more particularly, to synthesis of multiple different implementations of a design.

2. Description of the Related Art

Modern circuit design has evolved into a specialized field often referred to as electronic design automation in which computers and computer aided design (CAD) techniques are used to automate the integrated circuit (IC) design process. An IC design process typically begins with an engineer specifying the input/output signals, functionality and performance characteristics of a hardware circuit to be fabricated. These characteristics are captured in a high level hardware language model, which represents a design at a higher level of abstraction, which reduces the number of individual design objects that a designer needs to consider individually by perhaps orders of magnitude.

Synthesis can be defined broadly as a translation process from a behavioral description of a design to a structural description of the design, such as the design of an IC. A structural representation typically comprises a one-to-many mapping of a behavioral representation onto a set of components in accordance with design constraints such as cost, area, delay and power consumption. Each component in a structural design, in turn may be defined by its own behavioral description. Thus, a design can be represented behaviorally at many different levels of abstraction, and different software-based synthesis tools typically are used depending upon the level of abstraction at which a design is specified.

It is not unusual during design of device such as an integrated circuit, for a developer to try out or test several alternative design implementations. Implementation changes are communicated to a software-based synthesis tool as changes in one or more design constraints, for example. Accordingly different implementations may be represented as different lower level abstraction models synthesized from slightly different constraints upon the design. The different models then may be separately simulated to ascertain which one best satisfies overall design requirements, for example.

As such, it is common practice to run a synthesis tool a plurality of times on a design that is only marginally different from that of previous runs, as bugs are found in the original specifications or different choices are selected in the constraints, or perhaps both are changed.

In the past, synthesis tools typically began each synthesis run from scratch, considering the inputs as presented, without regard for previous decisions and calculations. An unfortunate problem with this prior approach is that even a small change in an input to the synthesis tool could result in a relatively large change in the output model produced by the tool when compared with a previously produced output model, as areas of behavior that were not constrained get mapped into equally valid, yet significantly different structures in the later output model. Differences between the earlier and later output models can result in significant difficulties for a designer, since any validation through verification of the earlier output model could be of little use, as the later output model could be different in many ways from the previously synthesized output model. As a consequence, as a practical matter, verification of the later output model often must start from the beginning with no benefit from prior verification results.

Thus, there has been a need for an improved approach to synthesis of different output model implementations during design of a device such as an IC. The present invention meets this need.

SUMMARY OF THE INVENTION

In one aspect, a method of synthesis of a model representing a design is provided. Information representing a design at a level of abstraction is input to a synthesis tool. The synthesis tool is used to automatically translate the information representing a design at a level of abstraction to a model representing the design at a lower level abstraction. A record is produced representing the information input to the tool representing the design at the level of abstraction.

DETAILED DESCRIPTION OF THE PREFERRED EMBODIMENTS

Figure 1:
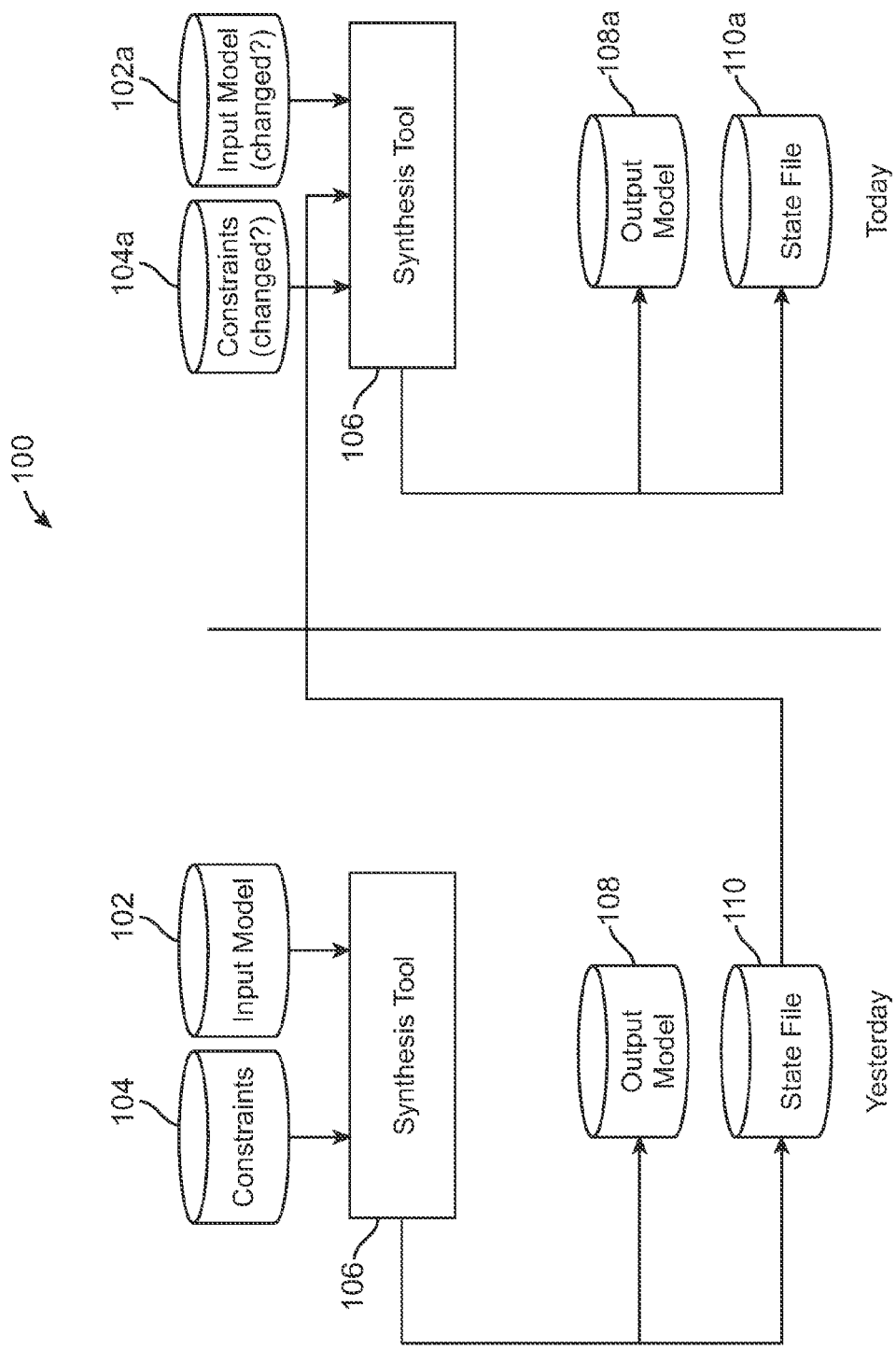
FIG. 1 is an illustrative flow diagram of an incremental synthesis system and process in accordance with an embodiment of the invention.

The following description is presented to enable any person skilled in the art to make and use a system and method for incremental synthesis in accordance with the embodiments of the invention, and is provided in the context of particular applications and their requirements. Various modifications to the preferred embodiments will be readily apparent to those skilled in the art, and the generic principles defined herein may be applied to other embodiments and applications without departing from the spirit and scope of the invention. Moreover, in the following description, numerous details are set forth for the purpose of explanation. However, one of ordinary skill in the art will realize that the invention might be practiced without the use of these specific details. In other instances, well-known structures and devices are shown in block diagram form in order not to obscure the description of the invention with unnecessary detail. Items that appear in more than one drawing may be labeled with the same reference numeral in all drawings in which they occur. Thus, the present invention is not intended to be limited to the embodiments shown, but is to be accorded the widest scope consistent with the principles and features disclosed herein.

FIG. 1 is an illustrative flow diagram of an incremental synthesis process 100 in accordance with an embodiment of the invention. At time1 (e.g., "Yesterday"), a time1 input model 102 plus associated time1 input constraints 104 are input to a software-based synthesis tool 106. The tool 106 translates the time1 input model 102 to a time1 output model 108 compliant with the time1 input constraints 104. The tool 106 also produces a time1 state file 110, which indicates information used by the tool 106 to produce the time1 output model 108.

At time2 (e.g., "Today"), an input model 102a, which may be a modified version of the input model 102 of time1, plus associated input constraints 104a, which may be a modified version of the input constraints 104 of time1, plus the time1 state information 110 produced by the synthesis tool 106 on time1 are input to the tool 106. The tool 106 translates the time2 input model 102a into a time2 output model 108a compliant with the time2 input constraints 104a, while using the time1 state information 110 to ensure that the tool 106 processes the input (i.e. model and constraints) the same way that it did at time1 to the extent that user supplied changes do not instruct otherwise. The tool 106 also produces a time2 state file 110a, which indicates information used by the tool 106 to produce the time2 output model 108a.

At time2, the synthesis tool 106 uses information in the state file 110 to determine whether the input model or constraints have changed since the time1 synthesis run. If the tool 106 detects changes, then it processes unchanged areas of the input (i.e. model and constraints) just as it did during the time1 synthesis run, and it processes changed areas of the input in accordance with the newly changed input provided at time2.

More specifically, for the time1 synthesis run, the tool 106 stores in a state file 110 a history of all of the implementation choices made by the tool 106 itself in the course of the time1 synthesis run. These tool-selected implementation choices are referred to herein as "soft constraints,". Note that soft constraints arise only if the tool 106 makes an implementation choice in the absence of a user selected implementation choice. The tool 106 also produces a set of change indicators to enable efficient recognition of precisely what areas of user-provided input information (e.g., input model and/or input constraints) model have changed from a prior synthesis run (pre-time1 run not shown). The change indicator can be implemented, for example by retaining the complete text of the user-provided input information (e.g., text of the input model plus text of the input constraints) from a prior run or perhaps as a checksum of the non comment areas of the input model and/or input constraints, or as some indication of changes to the content of user-provided input information. The soft constraints and change indicators can be stored in a simple text file, or in a database, or other similar through other suitable storage mechanisms.

Tool-selected implementation choices are made when the user provides no additional input. An example of such a choice is the mapping of each group of five addition operations in a design to a single adder, and constructing a multiplexer to coordinate the sharing of the resource. Such things are done by default according to built in rules of the tool. Let us assume, for example, that the tool will map five at a time, the first five add operations encountered use one adder and the sixth through 10$^{th}$ use a second adder, and so on. Absent any additional information, this seems a reasonable balance of speed and space. The reasoning might go as follows, more adders would allow the design to run faster when multiple add operations are available to run at the same time. However, each adder requires a significant amount of space, and if in truth, certain sets of add operations are rarely ready to run at the same time, it is a bad design decision to waste space on them.

When a modified design, such as modified input model 102a and/or a modified output model 104a is input to the synthesis tool 106, the tool calculates the change indicator of each element of the modified design, and where the change indicator indicates that there was no change, and there is no user constraint covering this part of the design, the synthesis tool would apply the retained soft constraints, and hence translate that part of the design precisely as it did the last time. Basically, the tool 106 processes unchanged areas of the input the same way at time2 that it did at time1. The change indicator is used to discern what areas of the user-provided input have not changed. The tool compares change indicator information from the time1 run with corresponding information from the time2 run. For unchanged areas of the user-provided input, the tool 106 makes the same tool-selected implementation choices (i.e. uses the same "soft constraints") that it did at time1. Changes in the produced output model should be restricted to direct effects of changes in the input model or input constraints, even when the aspects of the output model were left free to the tool to make arbitrary choices. For those areas of the user-provided input where the change indicator indicates a change to the user-provided information, the retained soft constraints are not applied. As used herein, a regular constraint includes any user-specified constraint. Regular constraints supersede the soft constraints.

In one embodiment, in the example of FIG. 1, as the tool 106 processes the time2 input, it examines each element of the input. If the tool 106 encounters an element subject to both a regular constraint and a soft constraint, the soft constraint is considered only when it does not conflict with the regular constraint. Elements subject to only a soft constraint are implemented according to the constraint. Elements not subject to a soft or regular constraint are implemented in whatever suitable manner the tool 106 may choose. The resulting output logic is written out, together with a new data file 110a including a new set of soft constraints that capture the complete result, and with change indicators for the input design.

As a result of this system and method, the output logic produced from a slightly modified input design will be as similar as possible to the output logic produced from the original input design, thereby delivering the desired incremental synthesis. Consider for example the situation in which a user who provides an input model and input constraints to the tool 106 at time1. The user selects various options from a menu of the tool 106 to guide the processing of this input information. These inputs are regular constraints in this example, since they are user-specified. For example, the user my chose to move a particular high frequency add operation from a shared adder to its own dedicated adder, so as to get more speed at the cost of a small increase in area. Finally assume for example, that the user is generally pleased with these selections and instructs the tool 106 to commence the time1 synthesis run. At time2 (e.g., the next day), the user makes a few changes to the input model and input constraints which collectively are still very similar to the input provided at time1, perhaps only 5% of the lines are different. The tool 106 detects these changed areas, and areas that have not changed and processes the new input according to the rules described above. As a result, changes in the produced time2 output model 108a (i.e. areas different from the time1 output model 108) should be restricted to direct effects of changes in the user-provided input information (e.g. input model or input constraints), even when the aspects of the synthesis process were left open to the tool 106 to make arbitrary implementation choices.

The user gets the very large benefit in that a small change in the input results in a small change in the output. In truth the user will likely run the synthesis process many times a day, for many weeks; and as parts of the design get close to bug free, and hence undergo little additional change to the input from day to day, and the user will begin to become familiar with the generated output for these sections. The only thing changing in the output will be those few areas that still have bugs. As such, the user can focus her verification efforts on the parts that still have bugs, and not be subject to the confusion that results from other tools which produce radically different outputs for two input models that are quite similar to one another.

Figure 2:
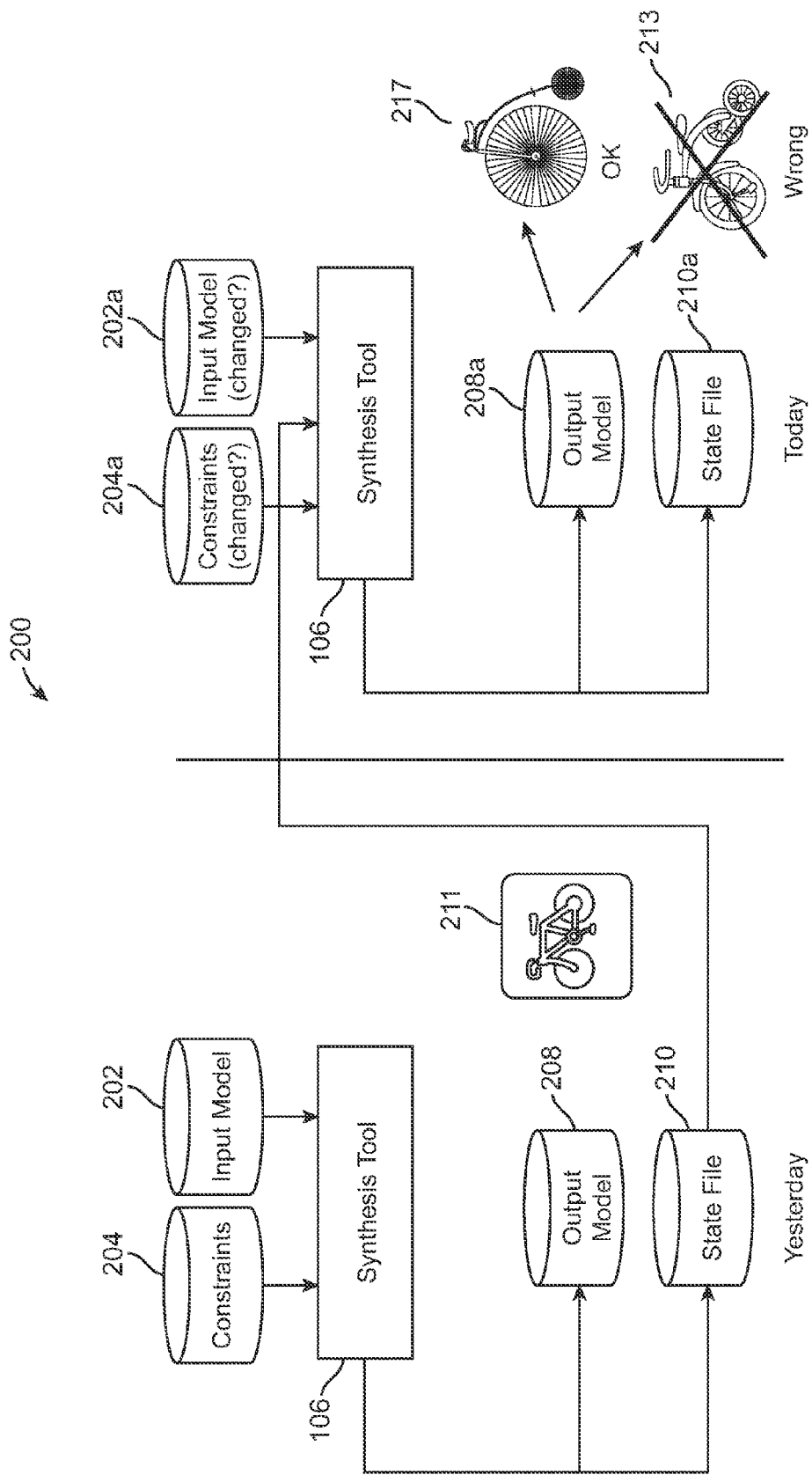
FIG. 2 is an illustrative flow diagram of an incremental synthesis system and process in accordance with an embodiment of the invention.

FIG. 2 is an illustrative flow diagram of a process in accordance with an embodiment of the invention applied to a simpler technology, bicycles design to aid in comprehension. Assume that an earlier time1 high level input 202, 204 states: "Build a human powered transportation system, using the spoked wheel and the pedal". These are the regular (user-provided) constraints at time1. Running the tool 106 at time1 with these inputs could result in an output model 208 representing a unicycle, a bicycle, a tricycle, or a four wheeled go-cart, since the regular constraints do not specify sufficient details to indicate which of these it should be. Each of these are a entirely correct, valid lower level implementations of the high level input 202, 204. For purposes of discussion, let us assume the tool produces an output model 208 representing a classic bicycle 211, with equal sized wheels and handle bars. This implies that the tool made implementation choices, i.e. produced soft constraints, where the user did not. The tool 106 also produces a state file 210 indicating soft constraints and change indicators.

At time2, the tool 106 is run a second time. Assume that this time, the user provides additional high level input 202*a*, 204*a* that says, "Make the front wheel larger." Hence now the complete set of user-provided regular constraints is: "Build a human powered transportation system, using the spoked wheel and the pedal and make the front wheel larger". Based solely on these constraints, the tool 106 could this time create a tricycle 213, with a large front wheel, and two smaller rear wheels. However, because the user made her refinement based on the result of the first run of the tool, the tool will refer to the state file 210 and interpret these constraints based on both the set of inputs 202*a*, 204*a*, and the time1 current design 208, and instead produce a new bicycle 217, which has a large front wheel and a small rear wheel (like classic hikes). Hence in this second run, the time2 run, the requirement that the transportation system have two wheels is an implied "soft constraint;" Indeed, every parameter of the first output model 208 other than the use of a pedal and the use of a spoked wheel is a new soft constraint to the time2 run, and there are now four user-provided regular (or hard) constraints: 1) that the transportation system be human powered, 2) use the pedal, 3) use a spoked wheel, and 4) have the front wheel larger than other wheels.

Figure 3:
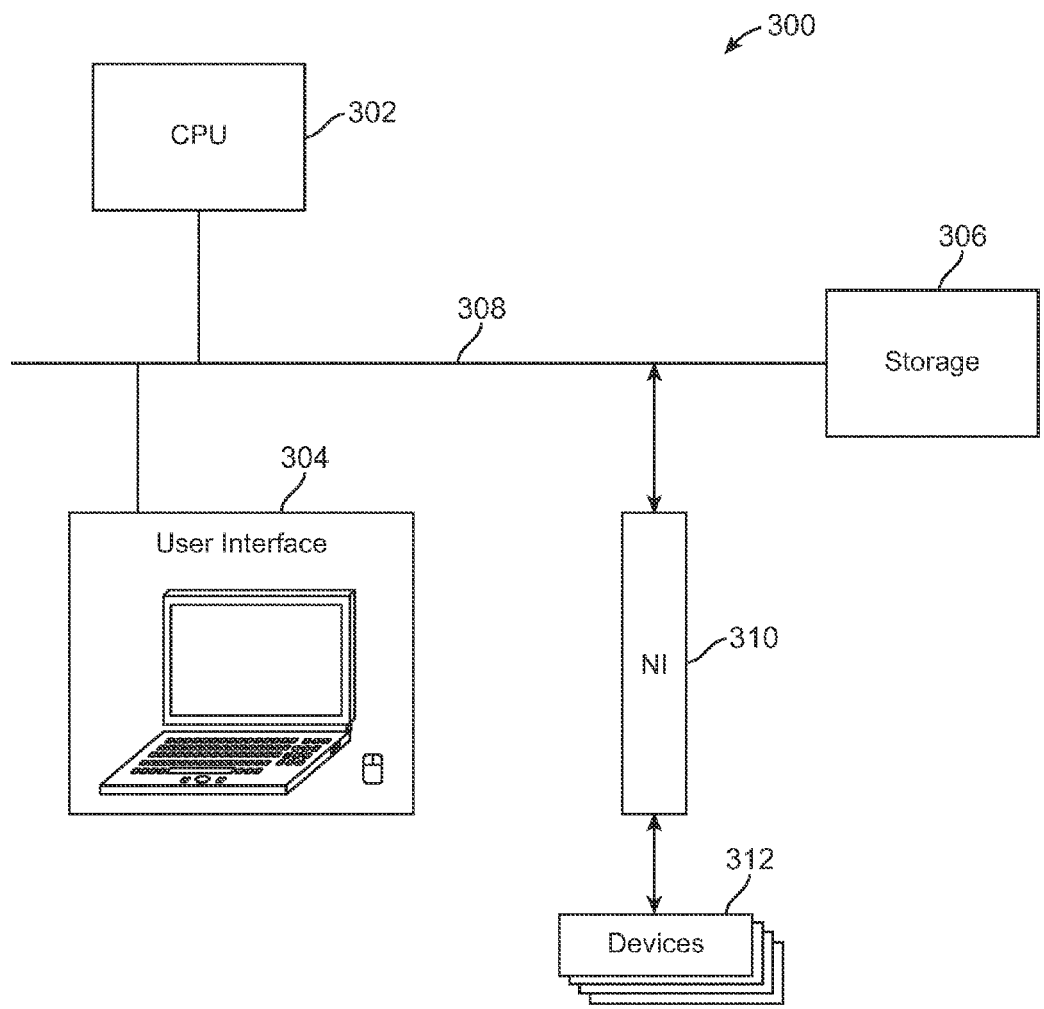
FIG. 3 is a schematic drawing of an illustrative computer system that can be programmed to implement a novel synthesis tool of FIGS. 1-2 in accordance with an embodiment of the invention.

FIG. 3 is a schematic drawing of an illustrative computer system 300 that can be programmed to implement an incremental synthesis system and method of FIGS. 1-2 in accordance with an embodiment of the invention. The computer system 300 includes one or more central processing units (CPU's) 302, a user interface 304, computer readable storage media 306, a system bus 308, and one or more bus interfaces for connecting the CPU, user interface, memory and system bus together. The computer system also includes a network interface 310 for communicating with other devices 312 on a computer network. A computer readable input model and constraint file and corresponding output models and state files of FIGS. 1-2 may be provided, via bus 308, to and from interface 304, storage 308 or other devices 312, to and from the synthesis tool running from storage 308 on the CPU 302.

While the invention has been described herein with reference to various illustrative features, aspects and embodiments, it will be appreciated that the invention is susceptible of variations, modifications and other embodiments, other than those specifically shown and described. The invention is therefore to be broadly interpreted and construed as including all such alternative variations, modifications and other embodiments within its spirit and scope as hereinafter claimed.

The invention claimed is:

1. A method of synthesis of a model representing a design of an integrated circuit, the method comprising:

inputting to a synthesis tool information representing a modified input model of the design at a particular level of abstraction;

inputting user constraints;

inputting to the synthesis tool a state file that includes a record of at least one prior soft constraint choice made by the tool, in a prior translation of a prior input model of the design to a prior output model representing the design at a lower level of abstraction, in the absence of a user implementation choice;

using the synthesis tool to translate the information to an output model compliant with the inputted user constraints, representing the design at a lower level of abstraction, wherein translating the modified input model includes applying in the same manner the at least one prior soft constraint choice included in the inputted state file if the user constraints do not include a constraint choice selected by the user that conflicts with the at least one prior soft constraint; and producing a record of the information input to the synthesis tool that guided the translation of the modified model, the information including at least one soft constraint choice made by the tool in the course of translating the modified model in the absence of user implementation choice, into an output state file.

2. A computer readable storage medium storing code for performing the method of claim 1.

3. A computer system programmed to carry out the method of claim 1.

4. The method of claim 1, wherein translating the modified input model includes applying a constraint choice selected by the user instead of the at least one prior soft constraint if the user constraints include a constraint choice that conflicts with the at least one prior soft constraint.

5. A method of synthesis of a model representing a design of an integrated circuit, the method comprising:

inputting to a synthesis tool information representing a first input model of the design at a particular level of abstraction;

receiving first user constraints;

using the synthesis tool to translate the first input model constraints to an output model representing the design at a lower level of abstraction compliant with the first user constraints; and producing a record of the information input to the synthesis tool that guided the translation, and soft constraint choices made by the tool in the absence of user implementation choice, into an output state file;

wherein the output state file identifies at least one soft constraint choice selected by the synthesis tool in translating the first input model to the output model;

receiving information representing a second input model of the design which is different from the first input model of the design;

receiving second user constraints;

using the synthesis tool to translate the second input model to a second output model representing the design at a lower level of abstraction compliant with the second user constraints, wherein translating the second input model includes applying in the same manner the at least one soft constraint choice identified in the output file if the second user constraints do not include a constraint choice that conflicts with the at least one soft constraint.

6. The method of claim 5,
wherein translating the second input model includes applying a constraint choice selected by a user from the translation of the input model, as stored in the output state file, in the same manner to the second input model.

7. The method of claim 5,
wherein translating the second input model includes applying a soft constraint choice selected by the synthesis tool from the translation of the input model, as stored in the output state file, in the same manner to the second input model.

8. The method of claim 5, further comprising:
producing a second output state file which identifies at least one choice selected by the synthesis tool for the soft constraint used in translating the second input model to the second output model.

9. The method of claim 5, further comprising:
inputting at least one additional constraint choice to the synthesis tool, the additional constraint choice being associated with the second input model.

10. A computer system comprising:

a CPU;

a storage;

a bus coupling the storage to the CPU;

wherein the storage stores code for execution by the CPU, the code performing:

inputting to a synthesis tool information representing a modified input model of the design at a particular level of abstraction;

inputting user constraints;

inputting to the synthesis tool a state file that includes a record of at least one prior soft constraint choice made by the tool, in a prior translation of a prior input model of the design to a prior output model representing the design at a lower level of abstraction, in the absence of a user implementation choice;

using the synthesis tool to translate the information to an output model compliant with the inputted user constraints, representing the design at a lower level of abstraction, wherein translating the modified input model includes applying in the same manner the at least one prior soft constraint choice included in the inputted state file if the user constraints do not include a constraint choice selected by the user that conflicts with the at least one prior soft constraint; and producing a record of the information input to the synthesis tool that guided the translation of the modified model, the information including at least one soft constraint choice made by the tool in the course of translating the modified model in the absence of user implementation choice, into an output state file.

* * * * *